United States Patent
Muramatsu et al.

(10) Patent No.: US 9,608,073 B2
(45) Date of Patent: Mar. 28, 2017

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Toru Muramatsu, Matsumoto (JP); Hiroki Wakimoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/932,889

(22) Filed: Nov. 4, 2015

(65) Prior Publication Data
US 2016/0141364 A1    May 19, 2016

(30) Foreign Application Priority Data

Nov. 13, 2014  (JP) .................................. 2014-230589

(51) Int. Cl.

| | |
|---|---|
| *H01L 29/08* | (2006.01) |
| *H01L 29/66* | (2006.01) |
| *H01L 29/73* | (2006.01) |
| *H01L 29/10* | (2006.01) |
| *H01L 29/739* | (2006.01) |
| *H03K 17/567* | (2006.01) |

(52) U.S. Cl.
CPC ...... *H01L 29/1095* (2013.01); *H01L 29/0834* (2013.01); *H01L 29/66333* (2013.01); *H01L 29/7393* (2013.01); *H01L 29/7395* (2013.01); *H03K 17/567* (2013.01)

(58) Field of Classification Search
CPC ............... H01L 21/304; H01L 21/2253; H01L 29/0821; H01L 29/7393; H01L 29/66325; H01L 29/0696; H01L 29/1095; H01L 29/08; H01L 29/66; H01L 29/73; H01L 29/0834; H01L 29/66333; H01L 29/7395
See application file for complete search history.

(56) References Cited

U.S. PATENT DOCUMENTS

| | | | |
|---|---|---|---|
| 5,444,271 A | 8/1995 | Kuwahara | |
| 2002/0100934 A1 | 8/2002 | Nakagawa et al. | |
| 2004/0256691 A1* | 12/2004 | Nemoto | ............. H01L 29/0619 257/491 |
| 2013/0092978 A1* | 4/2013 | Sugawara | .......... H01L 29/7395 257/139 |

FOREIGN PATENT DOCUMENTS

JP  2006-324431 A   11/2006

* cited by examiner

*Primary Examiner* — Fazli Erdem

(57) ABSTRACT

Provided is a semiconductor device comprising: a first conductivity type base layer having a MOS gate structure formed on its front surface side; a second conductivity type first collector layer formed on a rear surface side of the base layer; a second conductivity type second collector layer formed on a rear surface side of the first collector layer with a material the same with that of the base layer, the second collector layer formed to be thinner than the first collector layer and having a higher impurity concentration than that of the first collector layer; a collector electrode formed on a rear surface side of the second collector layer; and a second conductivity type separation layer surrounding the MOS gate structure on a front surface side of the base layer and formed from a front surface of the base layer to a front surface of the first collector layer.

8 Claims, 7 Drawing Sheets

SEMICONDUCTOR DEVICE AND METHOD OF MANUFACTURING SEMICONDUCTOR DEVICE

The contents of the following Japanese patent application(s) are incorporated herein by reference:
NO. 2014-230589 filed on Nov. 13, 2014.

BACKGROUND

1. Technical Field

The present invention relates to a semiconductor device, and a method of manufacturing a semiconductor device.

2. Related Art

An IGBT is known as one of power semiconductor devices (see Patent Documents 1 to 3, for example).

Patent Document 1: Japanese Patent Application Publication No. H6-69509

Patent Document 2: Japanese Patent Application Publication No. 2002-305305

Patent Document 3: Japanese Patent Application Publication No. 2006-324431

In an IGBT, a strong electric field acts on a p-n junction between an n type drift region and a p type collector region on a rear surface side at the time when a reverse bias is applied. For this reason, if there is a defect at the p-n junction portion, a reverse withstanding voltage lowers.

SUMMARY

In a first aspect of the present invention, a semiconductor device is provided, the semiconductor device comprising:
a base layer of a first conductivity type having a MOS gate structure being formed on a front surface side thereof;
a first collector layer of a second conductivity type formed on a rear surface side of the base layer;
a second collector layer of the second conductivity type formed on a rear surface side of the first collector layer with a material that is the same with that of the base layer, the second collector layer being formed to be thinner than the first collector layer and to have a higher impurity concentration than that of the first collector layer;
a collector electrode formed on a rear surface side of the second collector layer; and
a separation layer of the second conductivity type that surrounds the MOS gate structure on a front surface side of the base layer and is formed from a front surface of the base layer to a front surface of the first collector layer.

At the first collector layer, at least a region that is adjacent to the separation layer may contain impurities diffused from the front surface side of the base layer and impurities diffused from the rear surface side of the base layer. At the first collector layer, an impurity concentration of a region that is adjacent to the separation layer may be higher than an impurity concentration, at the same depth position, of a region of the first collector layer that is not adjacent to the separation layer.

The base layer, the first collector layer and the separation layer may be formed by implanting impurities corresponding to the second conductivity type selectively to a region on the front surface side of the base substrate of the first conductivity type, the region being corresponding to the separation layer, and implanting impurities corresponding to the second conductivity type to the rear surface side of the base substrate, and then performing a diffusion process simultaneously on the impurities implanted from the front surface side and rear surface side of the base substrate. The first collector layer having a predetermined thickness may be formed by grinding a rear surface of the first collector layer after performing the diffusion process.

The semiconductor device may be of a punch-through type. The first collector layer may be formed to contact a rear surface of the base layer. Also, the impurity concentration of the rear surface of the first collector layer may be lower than the impurity concentration of a front surface of the separation layer. Also, the distribution of the impurity concentration in the depth direction of a region of the first collector layer that is adjacent to the separation layer may have a minimum value.

In one aspect, a semiconductor device may comprise:
a base layer of a first conductivity type having a MOS gate structure being formed on a front surface side thereof;
a first collector layer of a second conductivity type formed on a rear surface side of the base layer; and
a separation layer of the second conductivity type that surrounds the MOS gate structure on a front surface side of the base layer and is formed from a front surface of the base layer to a front surface of the first collector layer, wherein
at the first collector layer, at least a region that is adjacent to the separation layer contains impurities diffused from the front surface side of the base layer and impurities diffused from the rear surface side of the base layer.

In a second aspect of the present invention, a method of manufacturing a semiconductor device is provided, the method comprising:
implanting impurities corresponding to a second conductivity type selectively to a predetermined region on a front surface side of a base substrate of a first conductivity type and implanting impurities corresponding to the second conductivity type to a rear surface side of the base substrate;
performing a diffusion process simultaneously on the impurities on the front surface side and rear surface side of the base substrate to form the base layer of the first conductivity type, a first collector layer of the second conductivity type formed on the rear surface side of the base layer, and a separation layer of the second conductivity type formed from a front surface of the base layer to a front surface of the first collector layer;
forming a MOS gate structure on a region on the front surface side of the base layer surrounded by the separation layer;
implanting impurities corresponding to the second conductivity type to a rear surface side of the first collector layer to form a second collector layer of the second conductivity type formed with a material that is the same with that of the base layer, the second collector layer being formed to be thinner than the first collector layer and to have a higher impurity concentration than that of the first collector layer; and
forming a collector electrode on a rear surface side of the second collector layer.

The method may further comprise, after the diffusing, grinding a rear surface of the first collector layer to adjust a thickness of the first collector layer. The grinding may be performed after the formation of the MOS gate structure and before the formation of the collector electrode. In the implantation, a concentration per unit area of the impurities implanted from the rear surface side of the base substrate may be lower than a concentration per unit area of the impurities implanted from the front surface side of the base substrate.

In the grinding, the first collector layer may be ground until a region of the first collector layer that is adjacent to the separation layer is exposed to a rear surface thereof. In the diffusion, the impurities may be diffused at temperature that is equal to or higher than the temperature at which a metal electrode included in the MOS gate structure melts. In the diffusion, the base substrate may be annealed until a region in which the impurities implanted from the front surface side of the base substrate are diffused and a region in which the impurities implanted from the rear surface side of the base substrate are diffused overlap.

In one aspect, a method of manufacturing a semiconductor device may comprise:

implanting impurities corresponding to a second conductivity type selectively to a predetermined region on a front surface side of a base substrate of a first conductivity type and implanting impurities corresponding to the second conductivity type to a rear surface side of the base substrate; and performing a diffusion process simultaneously on the impurities on the front surface side and rear surface side of the base substrate to form the base layer of the first conductivity type, a first collector layer of the second conductivity type formed on the rear surface side of the base layer, and a separation layer of the second conductivity type formed from a front surface of the base layer to a front surface of the first collector layer.

In a third aspect of the present invention, a module is provided, the module comprising the semiconductor device according to the first aspect and a diode that is connected in parallel with the semiconductor device.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
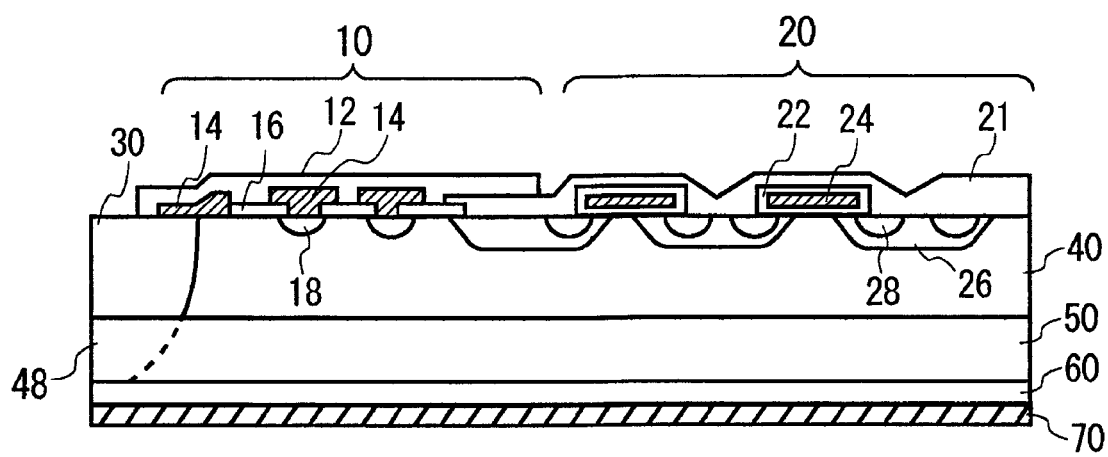
FIG. 1 is a figure that shows a configurational example of a semiconductor device 100.

FIG. 1 is a figure that shows a configurational example of a semiconductor device 100. FIG. 1 shows a cross-section of the semiconductor device 100. The semiconductor device 100 is an IGBT having a MOS gate structure on its front surface side, and a p-n junction on its rear surface side. The semiconductor device 100 according to the present example comprises a MOS gate structure 20, a voltage withstanding structure section 10, a separation layer 30, a base layer 40, a first collector layer 50, a second collector layer 60 and a collector electrode 70.

The base layer 40 is a semiconductor layer of a first conductivity type having the MOS gate structure 20 formed on a front surface side thereof. The base layer 40 according to the present example is an n− type silicon layer. When the semiconductor device 100 is of a non-punch through type, the base layer 40 has a thickness that does not allow a depletion layer in the p-n junction with a p region on the front surface side to reach the first collector layer 50.

The MOS gate structure 20 has an emitter electrode 21, an insulating film 22, a gate electrode 24, a second conductivity type region 26 and a first conductivity type region 28. In the present example, the first conductivity type region 28 is an n+ type region formed on the front surface side of the base layer 40. Also, the second conductivity type region 26 is a p type region that surrounds the first conductivity type region 28 and is formed to separate the first conductivity type region 28 from the base layer 40. When a predetermined voltage is applied to the gate electrode 24, a channel is formed in the second conductivity type region 26 immediately below the gate electrode 24, and the first conductivity type region 28 and the base layer 40 become conductive. Thereby, the MOS gate structure 20 operates as a MOSFET.

The first collector layer 50 has the second conductivity type, and is formed on the rear surface side of the base layer 40. The rear surface of the base layer 40 refers to a surface that is opposite to the front surface on which the MOS gate structure 20 is formed. The first collector layer 50 according to the present example is a p− type silicon layer. The first collector layer 50 may be formed to contact the rear surface of the base layer 40.

The second collector layer 60 has the second conductivity type, and is formed on the rear surface side of the first collector layer 50. The rear surface of the first collector layer 50 refers to a surface that is opposite to a surface contacting the base layer 40. The second collector layer 60 has a thickness in the stacking direction that is thinner than that of the first collector layer 50, and has a higher impurity concentration than that of the first collector layer 50. The second collector layer 60 according to the present example is a p+ type silicon layer. The base layer 40, the first collector layer 50 and the second collector layer 60 are formed with the same material (silicon in the present example).

The collector electrode 70 is formed on the rear surface side of the second collector layer 60. The rear surface of the second collector layer 60 refers to a surface that is opposite to a surface contacting the first collector layer 50. The collector electrode 70 is formed by vapor-depositing or sputtering, for example, aluminum on the rear surface side of the second collector layer 60.

The separation layer 30 has the second conductivity type, and is formed from the front surface of the base layer 40 to the front surface of the first collector layer 50 (that is, the rear surface of the base layer 40). The separation layer 30 according to the present example is of a p+ type. Also, the separation layer 30 is provided, on the front surface side of the base layer 40, to surround the MOS gate structure 20. For example, the separation layer 30 is formed on a side surface of the semiconductor device 100. The side surface of the semiconductor device 100 may be a dicing surface that is formed when the semiconductor device 100 is cut out from a wafer. Thereby, the base layer 40 of the first conductivity type can be prevented from being exposed to the side surface of the semiconductor device 100 and the depletion layer can be prevented from being exposed to the side surface of the semiconductor device 100, so the reverse withstanding voltage can be ensured. The first collector layer 50 has a region 48 adjacent to the separation layer 30. The region 48 adjacent to the separation layer 30 refers to a region where both impurities implanted and diffused from the front surface side of the base layer 40 to form the separation layer 30 and impurities implanted and diffused from the rear surface side of the base layer 40 to form the first collector layer 50 are present.

The voltage withstanding structure section 10 is provided on the front surface side of the base layer 40 and between the MOS gate structure 20 and the separation layer 30. The voltage withstanding structure section 10 has one or more regions 18, one or more electrodes 14, one or more insulating films 16 and a protective film 12. The regions 18 are regions of the second conductivity type formed in the base layer 40. A depletion layer formed between the regions 18 and the base layer 40 couples with a depletion layer between the second conductivity type region 26 of the MOS gate structure 20 and the base layer 40. Thereby, an end portion of the depletion layer can be arranged in the voltage withstanding structure section 10 which is on the outer side of the MOS gate structure 20, and thus the withstanding voltage of the MOS gate structure 20 can be maintained. The electrodes 14 are connected with the regions 18 that are not covered with the insulating film 16. By applying a voltage to the electrodes 14, the width of the depletion layer between the region 18 and the base layer 40 can be adjusted. Also, the electrodes 14 may be provided also to the separation layer 30.

Normally, in a non-punch-through type IGBT, a p type collector layer is formed by grinding an n type substrate formed from an FZ crystal, and then implanting boron ions onto the rear surface side of the substrate and performing laser annealing or the like. Generally, the p type collector layer is formed to be very thin. For example, when a laser with a wavelength of 532 nm is used in laser annealing, the thickness of the p type collector layer is approximately 0.25 µm. Then, a collector electrode is formed on the rear surface side of the p type collector layer.

Because, as described above, a normal collector layer is very thin, when a scratch occurs on the rear surface side of the collector layer or an alloy spike from the collector electrode occurs during a wafer process or a module assembling step, such a scratch, spike or the like easily penetrates the collector layer. If a spike or the like penetrates the collector layer and reaches the p-n junction, reverse leakage current increases.

In contrast, the semiconductor device 100 is provided with, on the front surface side of the second collector layer 60, the first collector layer 50 that is thicker than the second collector layer 60. Thereby, even if the thickness of the second collector layer 60 is 1 µm or less, a scratch, spike or the like can be prevented from reaching the p-n junction portion between the first collector layer 50 and the base layer 40. Accordingly, reverse leakage current can be decreased, and the reverse withstanding voltage can be improved. As one example, the semiconductor device 100 can be used for uses such as a matrix converter that requires a reverse withstanding voltage. Also, by making the concentration of the second collector layer 60 high, the contact resistance with the collector electrode 70 can be lowered. Also, by making the concentration of the first collector layer 50 low, the tail current at the time of turn-off can be lowered, and the turn-off period of the semiconductor device can be shortened.

Figure 2:
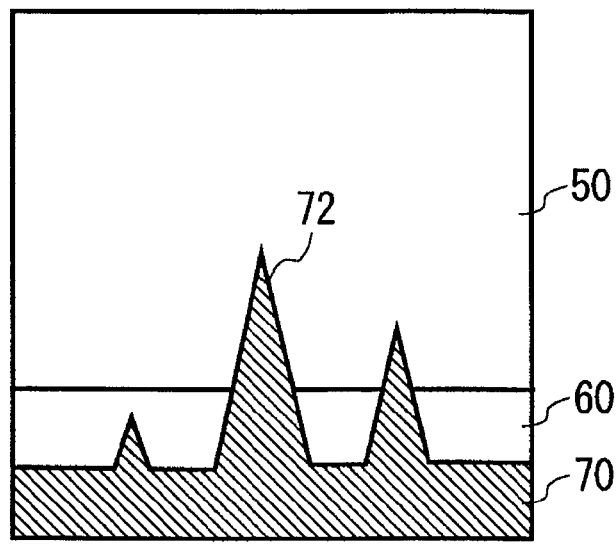
FIG. 2 is a figure that shows one example of an alloy spike 72.

FIG. 2 is a figure that shows one example of an alloy spike 72. FIG. 2 shows cross-sections of the collector electrode 70, the second collector layer 60 and the first collector layer 50. The alloy spike 72 is formed by a metal of the collector electrode 70 being alloyed with semiconductors of the second collector layer 60 and the first collector layer 50, and penetrating the inner part of the collector layer in a spike-like form. As described above, it is possible to prevent the alloy spike 72 from reaching the p-n junction portion by providing the thick first collector layer 50. Because the depth of the alloy spike 72 or the scratch is approximately 1 µm, the sum of the thicknesses of the first collector layer 50 and the second collector layer 60 is preferably 2 µm or larger.

The first collector layer 50 and the second collector layer 60 in the semiconductor device 100 according to the present example are formed by implanting and diffusing impurities on the rear surface side of the base substrate. When the thick first collector layer 50 is formed, high-temperature and prolonged annealing becomes necessary. Prolonged annealing is not preferred because it lowers the manufacturing efficiency. Accordingly, preferably the first collector layer 50 is formed in an efficient manner.

Figure 3:
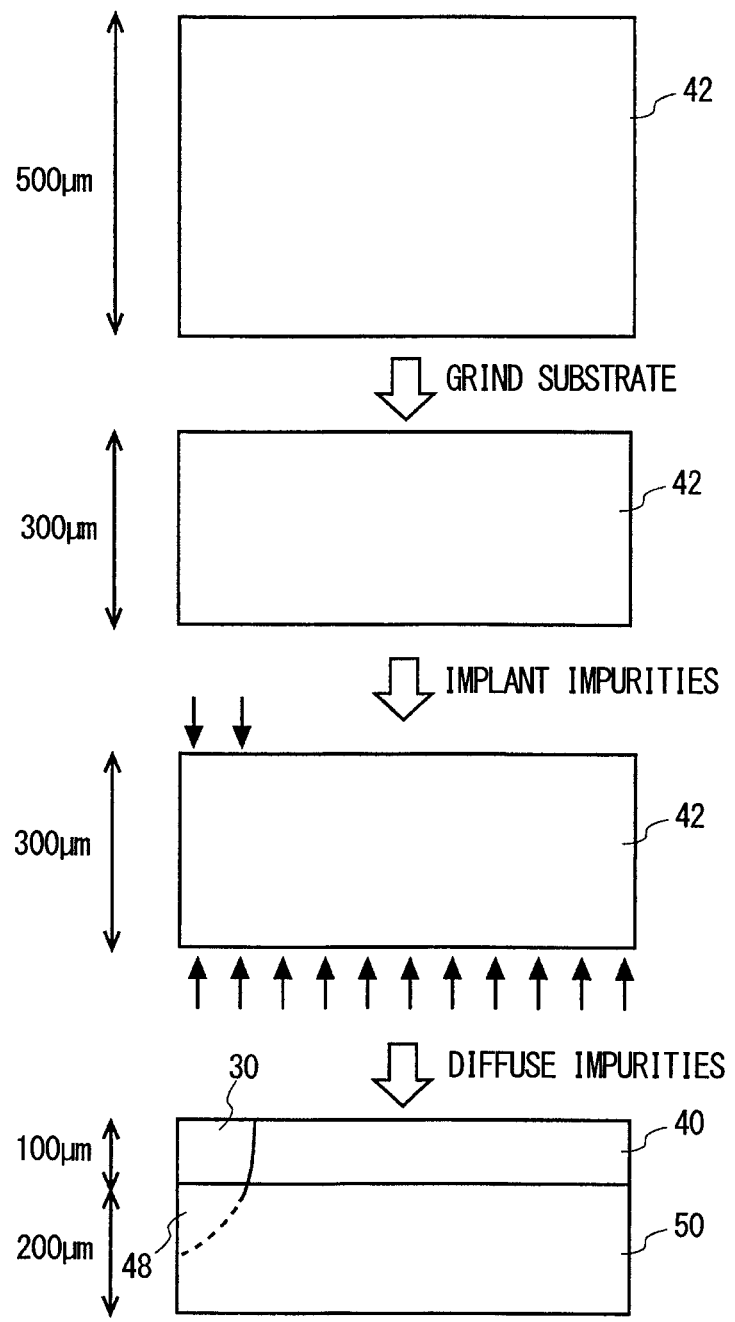
FIG. 3 is a figure that shows one example of a step of manufacturing the semiconductor device 100.

FIG. 3 is a figure that shows one example of a step of manufacturing the semiconductor device 100. FIG. 3 shows cross-sections of respective members. First, a base substrate 42 of the first conductivity type is prepared. The base substrate 42 may be a substrate that is cut out from an FZ crystal manufactured by a floating zone method.

Next, at a substrate grinding step, the base substrate 42 is ground to a predetermined thickness. In the present example, the 500-µm base substrate 42 is ground to 300 µm. The thickness after grinding may be determined according to the withstanding voltage the semiconductor device 100 should have. For example, if the class of withstanding voltage is 600 V or 1200 V, the base substrate 42 is ground to approximately 280 µm and 380 µm, respectively.

Next, at an impurity implantation step, impurities are implanted to the base substrate 42. A mask oxidation film having a predetermined pattern may be formed on the rear surface of the base substrate 42, and impurities may be implanted to the rear surface side of the base substrate 42 that is not covered with the mask oxidation film. Also, impurities corresponding to the second conductivity type may be implanted entirely to the rear surface side of the base substrate 42. When impurities are implanted to the rear surface side of the base substrate 42, a resist may be applied onto the front surface side of the base substrate 42 for a purpose of protecting the front surface side. In the present example, impurities are boron ions, aluminum ions or the like. In the present example, impurities at a concentration of approximately 5E15 $cm^{-2}$ are implanted to the rear surface side of the base substrate 42. Impurities at a dosage of from approximately $1\times10^{15}$ $cm^{-2}$ to $5\times10^{15}$ $cm^{-2}$ may be implanted to the rear surface side of the base substrate 42.

Also, a mask oxidation film having a predetermined pattern is formed on the base substrate 42, and the front surface of the base substrate 42 that corresponds to the separation layer 30 is exposed. Then, impurities corresponding to the second conductivity type are implanted selectively to the exposed front surface of the base substrate 42. The impurities are implanted for example to surround a predetermined region along a dicing line. Impurities at a concentration of approximately 5E15 cm$^{-2}$ are implanted to the front surface side of the base substrate 42. Impurities at a dosage of from approximately $1\times10^{15}$ cm$^{-2}$ to $5\times10^{15}$ cm$^{-2}$ may be implanted to the front surface side of the base substrate 42. Regarding the order of implanting impurities, impurities may be implanted first to the front surface side of the base substrate 42, or simultaneously to the front surface side and the rear surface side. In FIG. 3, ranges in which impurities are implanted are indicated with arrows.

Next, in an impurity diffusion step, a diffusion process is performed simultaneously on the impurities that are implanted on the front surface side and rear surface side of the base substrate 42. In the impurity diffusion step, impurities may be diffused by annealing the base substrate 42. In the present example, the base substrate 42 is annealed for example at 1300° C. for 100 hours. The temperature and duration of annealing can be adjusted depending on the thickness of the separation layer 30 that should be formed, the concentration of implanted impurities, or the like. Thereby, the base layer 40 of the first conductivity type, the first collector layer 50 of the second conductivity type that is formed on the rear surface side of the base layer 40, and the separation layer 30 of the second conductivity type that is formed from the front surface of the base layer 40 to the front surface of the first collector layer 50 are formed. When a resist for protection is applied onto the front surface side of the base layer 40, the resist is removed before annealing.

In the impurity diffusion step, impurities are diffused at least until the separation layer 30 and the first collector layer 50 are connected. Both impurities implanted and diffused from the front surface side of the base substrate 42 and impurities implanted and diffused from the rear surface side of the base substrate 42 may be present in a partial region of the first collector layer 50. In the present example, both impurities implanted from the front surface side of the base substrate 42 and impurities implanted from the rear surface side of the base substrate 42 are present in the region 48, of the first collector layer 50, that is adjacent to the separation layer 30.

In the present example, it is assumed that the concentration per unit area of impurities implanted from the front surface side of the base substrate 42 and the concentration per unit area of impurities implanted from the rear surface side are almost equal. Also, when it is assumed that the speed of diffusion of impurities implanted from the front surface side of the base substrate 42 toward the rear surface side and the speed of diffusion of impurities implanted from the rear surface side toward the front surface side are almost equal, in the present example, when the impurities implanted from the front surface side of the base substrate 42 are diffused to the depth of 150 μm, the impurities implanted from the rear surface side of the base substrate 42 are also diffused to the depth of 150 μm, and the separation layer 30 and the first collector layer 50 are connected. In the present specification, the position of the front surface of the first collector layer 50 is assumed to be the position at which the concentration of the impurities implanted and diffused from the rear surface side of the base substrate 42 becomes a predetermined value (for example, substantially zero).

In the example of FIG. 3, impurities implanted from the front surface side and rear surface side of the base substrate 42 are annealed until they are diffused to 200 μm in the depth directions, respectively. As a result of this, the thickness of the first collector layer 50 becomes 200 μm and the thickness of the region 48, the base layer 40 and the separation layer 30 becomes 100 μm. In addition to the impurities implanted and diffused from the rear surface side of the base substrate 42, the impurities implanted and diffused from the front surface side of the base substrate 42 are present in the region 48, of the first collector layer 50, that is adjacent to the separation layer 30.

Figure 4:
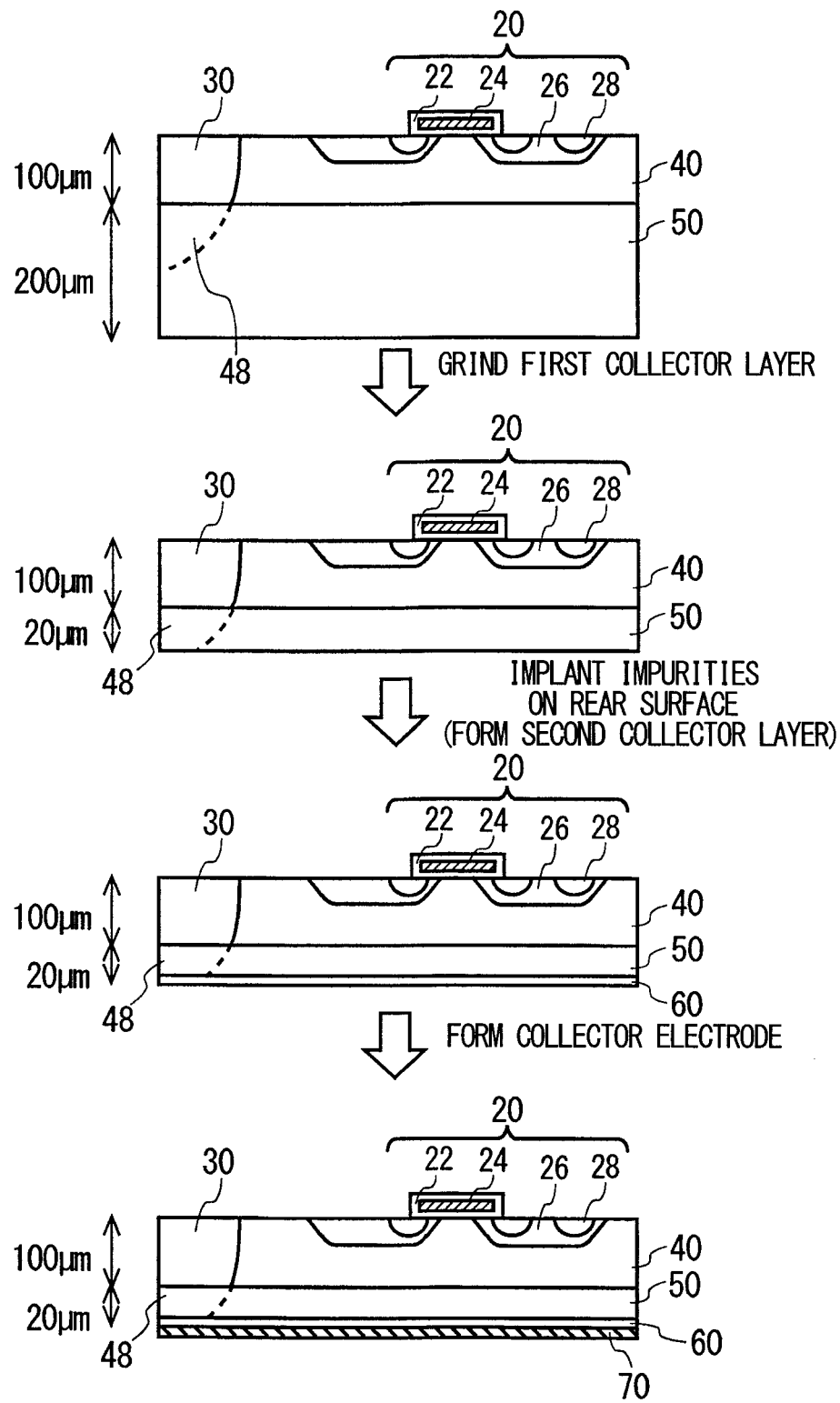
FIG. 4 is a figure that shows the continuation of the step of manufacturing the semiconductor device 100.

FIG. 4 is a figure that shows the continuation of the step of manufacturing the semiconductor device 100. After the impurity diffusion step shown in FIG. 3, in a MOS formation step, the MOS gate structure 20 is formed in a region on the front surface side of the base layer 40 and surrounded by the separation layer 30. Next, in a first collector layer grinding step, the rear surface of the first collector layer 50 is ground to adjust the thickness of the first collector layer 50. The thickness of the first collector layer 50 after grinding may be determined depending on the class of withstanding voltage the semiconductor device 100 is required to have. For example, for the class of withstanding voltage of 600 V, the sum of the thicknesses of the base layer 40 and the first collector layer 50 is approximately 100 μm, and for the class of withstanding voltage of 1200 V, the sum of the thicknesses of the base layer 40 and the first collector layer 50 is approximately 200 μm. Grinding of the base substrate 42 and the first collector layer 50 may be performed for example by using techniques such as mechanical grinding or chemical etching. In the present specification, the first collector layer 50 before and after grinding are in some cases called the first collector layer 50 before grinding and the first collector layer 50 after grinding. In the first collector layer grinding step, the first collector layer 50 may be ground until at least the region 48 is exposed to the rear surface of the first collector layer 50.

Next, in a second collector layer formation step, impurities corresponding to the second conductivity type are implanted to the rear surface side of the first collector layer 50 after grinding. Also, the implanted impurities are activated by performing laser annealing or the like on the rear surface side of the first collector layer 50. Thereby, the second collector layer 60 that is thinner than the first collector layer 50, and has a higher impurity concentration than that of the first collector layer 50 is formed.

Next, in a collector electrode formation step, the collector electrode 70 is formed on the rear surface side of the second collector layer 60. For example, a metal such as aluminum is sputtered or vapor-deposited on the rear surface side of the second collector layer 60 to form the collector electrode.

Because in the present example, the sufficiently thick first collector layer 50 is provided, scratch- or alloy spike-resistance is improved. The first collector layer 50 after grinding may have a thickness of 2 μm or larger. Also, as one example, a portion of the approximately 200-μm first collector layer 50 before grinding that corresponds to a predetermined thickness is ground to form the approximately 20-μm first collector layer 50 after grinding. For this reason, if an error of approximately several % occurs in the thickness of the first collector layer 50 before grinding, the sufficient thickness of the first collector layer 50 after grinding cannot be ensured in some cases. For this reason, the first collector layer 50 after grinding is preferably formed to have a design value of the thickness of, for example, 20 μm or larger. Thereby, even if an error occurs in the thickness of the first collector layer 50 before grinding, the sufficiently thick first collector layer 50 after grinding can be formed.

Also, in the present example, impurities for the first collector layer 50 are diffused simultaneously at the time when impurities for the separation layer 30 are diffused. For this reason, the duration of high-temperature annealing does not become long even when the thick first collector layer 50 is formed. Also, because the first collector layer 50 before grinding is formed earlier than the formation of the MOS gate structure 20, the MOS gate structure 20 can avoid being exposed to high-temperature annealing. For this reason, impurities for the first collector layer 50 can be diffused for example at temperature that is equal to or higher than the temperature at which a metal electrode included in the MOS gate structure 20 melts, for example at temperature of 500° C. or higher at which an aluminum metal electrode melts. Also, because the first collector layer 50 before grinding having a thickness that is approximately the same with or larger than the thickness of the separation layer 30 is formed, the first collector layer 50 after grinding can be easily formed to have various thicknesses.

Also, in the present example, the first collector layer grinding step is performed after the MOS formation step and before the collector electrode formation step. Thereby, the MOS formation step can be performed on a thick substrate before grinding, and defects such as a crack of a substrate during the MOS formation step can be decreased. However, when a processing apparatus used in the MOS formation step can handle a thin substrate after grinding, the first collector layer formation step may be performed before the MOS formation step.

Also, although in the present example, at the impurity implantation step, the concentration per unit area of impurities implanted from the rear surface side of the base substrate 42 and the concentration per unit area of impurities implanted from the front surface side of the base substrate 42 are made equal, in another example, the concentration per unit area of impurities implanted from the rear surface side of the base substrate 42 may be lower than the concentration per unit area of impurities implanted from the front surface side of the base substrate 42. By making the concentration of impurities implanted from the rear surface side of the base substrate 42 low, it is possible to reduce the thickness of the first collector layer 50 formed simultaneously with the separation layer 30 and reduce the grinding amount of the first collector layer 50.

In the manufactured semiconductor device 100, the impurity concentration at a portion near the front surface of the separation layer 30 may be approximately $1\times10^{17}$ $cm^{-3}$ to $5\times10^{18}$ $cm^{-3}$. Also, the impurity concentration at a portion near the rear surface of the separation layer 30 may be approximately $2$–$10^{14}$ $cm^{-3}$ to $2\times10^{15}$ $cm^{-3}$. Also, the impurity concentration of the first collector layer 50 at a portion near the boundary with the separation layer 30 may be approximately $2\times10^{14}$ $cm^{-3}$ to $2\times10^{15}$ $cm^{-3}$. Also, the impurity concentration of a region, on the rear surface of the first collector layer 50, that is not adjacent to the separation layer 30 may be approximately $2\times10^{14}$ $cm^{-3}$ to $2\times10^{15}$ $cm^{-3}$. Also, the impurity concentration of the second collector layer 60 may be approximately $1\times10^{17}$ $cm^{-3}$ to $5\times10^{18}$ $cm^{-3}$.

Figures 5A, 5B:
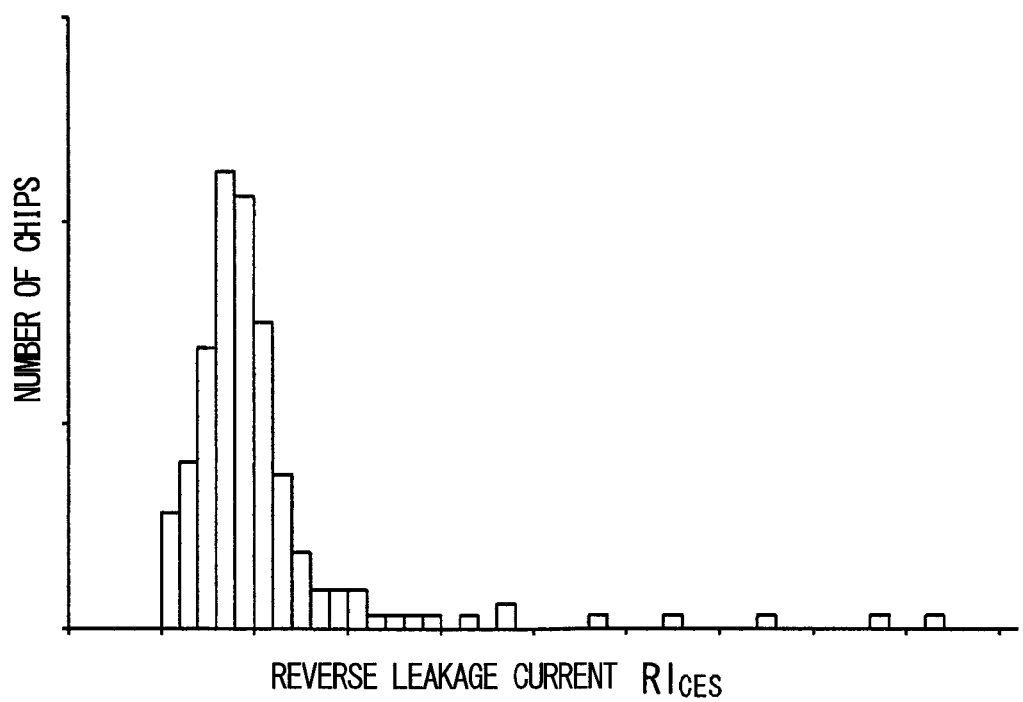
FIG. 5A is a figure that shows a comparative example of a histogram of reverse leakage current.
FIG. 5B is a figure that shows one example of a histogram of reverse leakage current.

FIG. 5A is a figure that shows a comparative example of a histogram of reverse leakage current. The semiconductor device according to the present example is not provided with the first collector layer 50 but has a 0.25-μm collector layer. FIG. 5B is a figure that shows one example of a histogram of reverse leakage current. The semiconductor device 100 according to the present example has the 0.25-μm second collector layer 60 and the 0.3-μm first collector layer 50. The class of withstanding voltage of the semiconductor devices in FIG. 5A and FIG. 5B is 700 V. As shown in FIG. 5A and FIG. 5B, by providing the first collector layer 50 thicker than the second collector layer 60, the number of elements that undergo large reverse leakage current is reduced.

Figure 6:
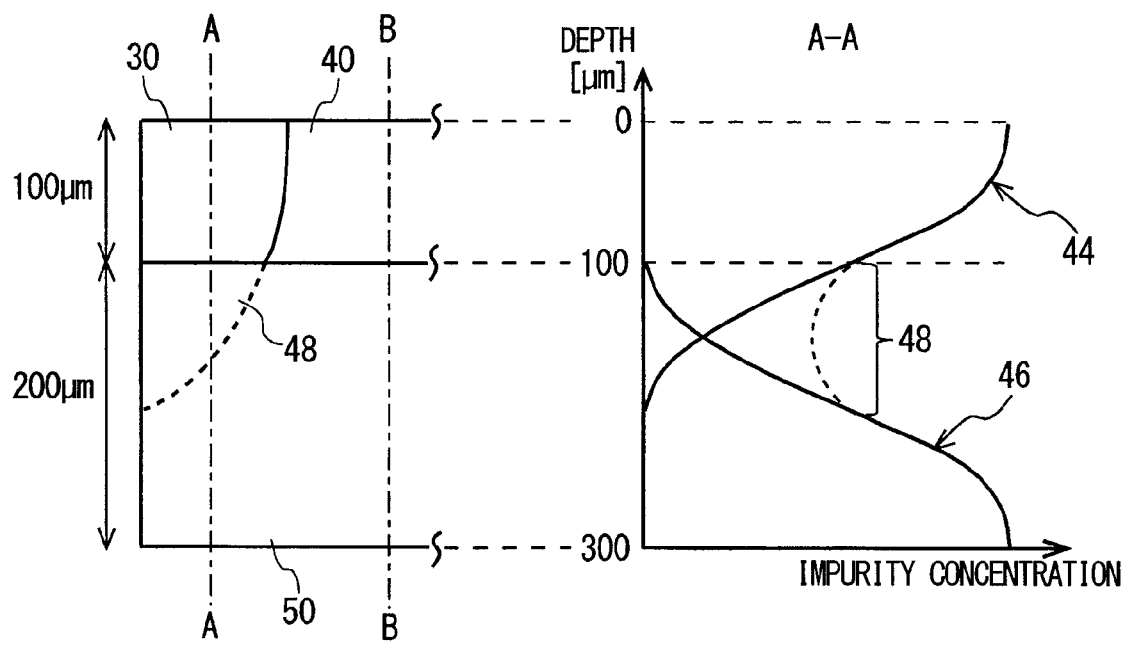
FIG. 6 is a figure for explaining the distribution of the impurity concentration in a base layer 40 and a first collector layer 50 before grinding.

FIG. 6 is a figure for explaining the distribution of the impurity concentration in the base layer 40 and the first collector layer 50 before grinding. The left half of FIG. 6 shows a cross-sectional view of the base layer 40 and the first collector layer 50 before grinding. Also, the right half of FIG. 6 shows a distribution example of the impurity concentration along the line A-A in the left half figure in the depth direction of the base layer 40 and the first collector layer 50 before grinding. The distribution of the impurity concentration corresponds to distribution after the impurity diffusion step is completed. The line A-A is positioned approximately at the center of the inner circumference and outer circumference of the separation layer 30 on the front surface of the base layer 40. It is assumed in the present example that the thickness of the base layer 40 is 100 μm and the thickness of the first collector layer 50 before grinding is 200 μm. Also, it is assumed that the concentrations per unit area and diffusion speeds of impurities implanted from the front surface side and rear surface side of the base substrate 42 are approximately the same.

Also, in the right half of FIG. 6, a curve 44 shows the concentration distribution of impurities implanted and diffused from the front surface side of the base substrate 42, and a curve 46 shows the concentration distribution of impurities implanted and diffused from the rear surface side of the base substrate 42. In the present example, the curve 44 and the curve 46 show Gaussian distribution. As described above, at the impurity diffusion step, the base substrate 42 is annealed until a region in which the impurities implanted from the front surface side of the base substrate 42 are diffused and a region in which the impurities implanted from the rear surface side of the base substrate 42 are diffused overlap. In the example of FIG. 6, in the region 48 from the depth of 100 μm to 200 μm (the front surface of the base layer 40 is assumed to be the depth of 0), both the impurities that are implanted and diffused from the front surface side and rear surface side of the base substrate 42 are present. The concentration distribution of impurities in the region 48 is distribution that is obtained by adding the curve 44 and the curve 46.

Figure 7:
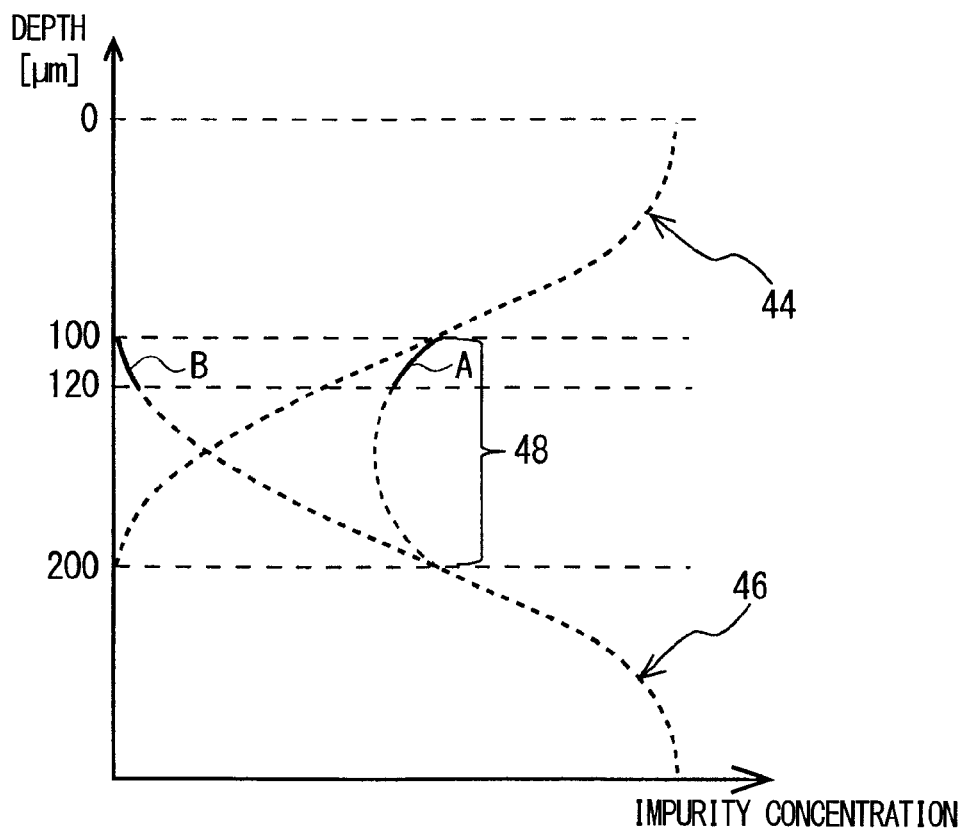
FIG. 7 is a figure that shows one example of the concentration distribution of impurities in the first collector layer 50 after grinding.

FIG. 7 is a figure that shows one example of the concentration distribution of impurities in the first collector layer 50 after grinding. The thickness of the first collector layer 50 after grinding according to the present example is 20 μm. A curve A shown in FIG. 7 shows the impurity concentration distribution along the line A-A of FIG. 6, and a curve B shows the impurity concentration distribution along the line B-B of FIG. 6. The curve A corresponds to the region 48 of the first collector layer 50 overlapping the separation layer 30 in the depth direction, and the curve B corresponds to a region, of the first collector layer 50, that does not overlap the separation layer 30 in the depth direction.

The curve A of FIG. 7 is equivalent to the sum of the curve 44 corresponding to impurities from the front surface side of the base substrate 42 and the curve 46 corresponding to impurities from the rear surface side at the depth position from 100 μm to 120 μm. That is, the region 48 adjacent to the separation layer 30 contains impurities diffused from the front surface side of the base substrate 42 and impurities diffused from the rear surface side of the base substrate 42.

It is possible to judge whether a predetermined region of the first collector layer 50 contains both the impurities diffused from the front surface side of the base substrate 42 and the impurities diffused from the rear surface side of the base substrate 42 based on the impurity concentration distribution. For example, the impurity concentration distribution in the separation layer 30 is approximated with Gaussian distribution, and the Gaussian distribution is extrapolated to the inside of a region of the first collector layer 50. At this time, if the actual impurity concentration distribution (for example, the curve A) in a predetermined region of the first collector layer 50 is higher than the Gaussian distribution (for example, the curve 44), it is deduced that, in addition to impurities from the front surface side of the base substrate 42, impurities from the rear surface side of the base substrate 42 (for example, the curve 46) are contained in the region. In particular, if the difference between the actual impurity concentration distribution (the curve A) and the above-described Gaussian distribution (for example, the curve 44) increases as the depth of the position from the front surface of the first collector layer 50 increases, it is deduced that impurities from the rear surface side of the base substrate 42 are contained in the region.

More specifically, if the curve A has a shape that is obtained by adding, to the above-described Gaussian distribution (for example, the curve 44), a tail portion of predetermined Gaussian distribution (for example, the curve 46) that has a vertex on the rear surface side of the first collector layer 50, it is deduced that impurities from the rear surface side of the base substrate 42 are contained in the region. By diffusing impurities from both the front surface and rear surface sides of the base substrate 42 in the region 48, of the first collector layer 50, that is adjacent to the separation layer 30, the impurities distribution of the region can be made further uniform. The impurity concentration in the depth direction of a semiconductor can be measured for example by secondary ion composition analysis, nuclear reaction, chemical analysis or the like.

Also, as shown in FIG. 7, the impurity concentration (for example, the curve A) of the region 48, in the first collector layer 50, that is adjacent to the separation layer 30 is higher than the impurity concentration (for example, the curve B), at the same depth position, of a region, of the first collector layer 50, that is not adjacent to the separation layer 30. Because the impurity concentration of the first collector layer 50 at a position not adjacent to the separation layer 30 can be lowered, the turn-off time can be shortened.

Also, when impurities at the same concentration are implanted from the front surface side and rear surface side of the base substrate 42, the impurity concentration on the front surface of the separation layer 30 after impurity diffusion and the impurity concentration on the rear surface of the first collector layer 50 before grinding are approximately the same. However, because the first collector layer 50 is ground to a desired thickness, the impurity concentration on the rear surface of the first collector layer 50 after grinding becomes lower than the impurity concentration on the front surface of the separation layer 30.

Also, as shown in FIG. 6 and FIG. 7, the distribution of the impurity concentration of the first collector layer 50 before grinding has a minimum value. When the thickness of the first collector layer 50 after grinding is equal to or larger than a predetermined value, the minimum value is included in the distribution of the impurity concentration of the first collector layer 50 after grinding. For this reason, even when the first collector layer 50 after grinding is made thick, the distribution of the impurity concentration of the region 48 adjacent to the separation layer 30 can be made uniform.

In the semiconductor device 100 explained in connection with FIG. 1 and FIG. 7, the first conductivity type is the n type, and the second conductivity type is the p type. In another example, the first conductivity type may be the p type, and the second conductivity type may be the n type.

Figure 8A:
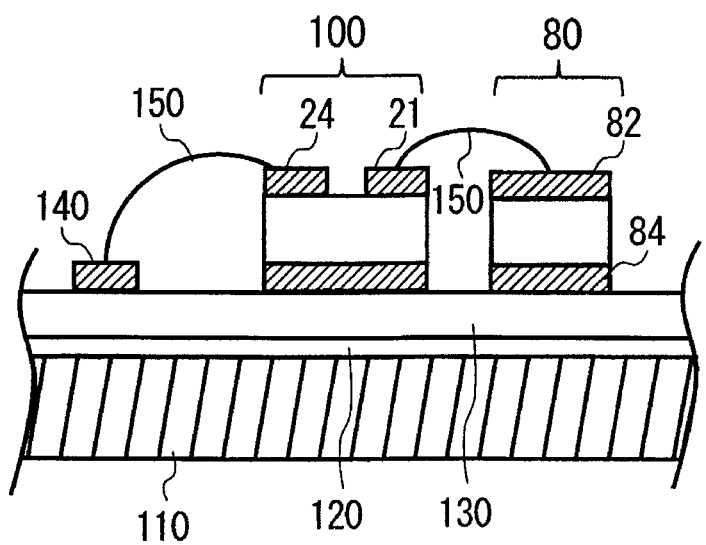
FIG. 8A shows a cross-sectional view of a module 200.
Figure 8B:
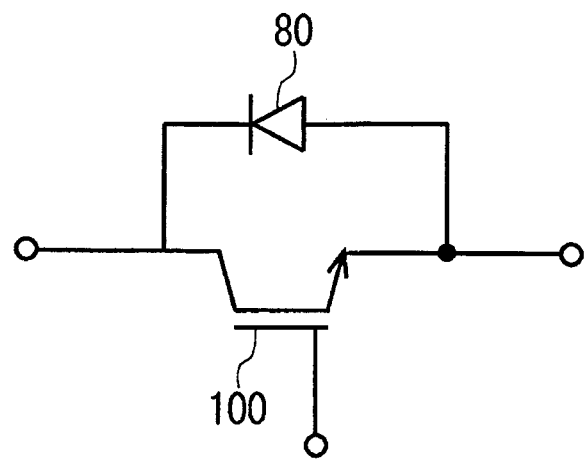
FIG. 8B is a figure that shows an equivalent circuit of the module 200.

FIG. 8A and FIG. 8B are figures that show one example of a module 200 equipped with the semiconductor device 100 therein. FIG. 8A shows a cross-sectional view of the module 200, and FIG. 8B is a figure that shows an equivalent circuit of the module 200.

As shown in FIG. 8A, the module 200 according to the present example comprises the semiconductor device 100 explained in connection with FIG. 1 to FIG. 7, a diode 80, an insulating substrate 130 and a heat releasing board 110. Also, the module 200 may have an insulative housing that houses these configurations and is formed with resin or the like. The heat releasing board 110 is formed with a metal or the like that has higher heat conductivity than that of the insulating substrate 130. The heat releasing board 110 may be formed over the entire rear surface of the housing.

The insulating substrate 130 is formed with an insulative material such as resin, and has a conductive pattern formed on its front surface side. The rear surface side of the insulating substrate 130 is fixed to the front surface of the heat releasing board 110 by a jointing material 120. Each of the semiconductor device 100 and the diode 80 is placed so that any of their electrodes is connected on the conductive pattern of the insulating substrate 130. Also, an electrode among the electrodes of the semiconductor device 100 and the diode 80 that does not contact the conductive patter on the insulating substrate 130 is electrically connected with another electrode or the like by a bonding wire 150 or the like.

In the present example, a cathode 84 of the diode 80 is connected to the collector electrode of the semiconductor device 100 via the conductive patter on the insulating substrate 130. Also, an anode 82 of the diode 80 is electrically connected to the emitter electrode 21 of the semiconductor device 100 via the bonding wire 150. The gate electrode 24 of the semiconductor device 100 is electrically connected to the electrode 140 on the insulating substrate 130 via the bonding wire 150. The electrode 140 is electrically connected to an external terminal exposed to the outside of the housing. Also, the emitter electrode 21 and the collector electrode of the semiconductor device 100 are electrically connected to an external terminal by the bonding wire 150 or the like.

The diode 80 according to the present example functions as a so-called FWD (Free Wheel Diode), but the function of the diode 80 is not limited thereto. Also, the module 200 may comprise a plurality of pairs of the semiconductor device 100 and the diode 80 in a single housing.

Figure 9:
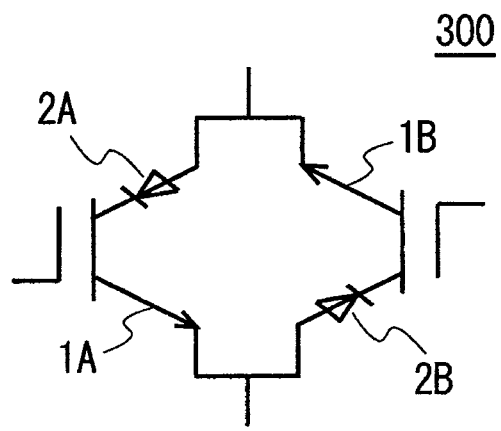
FIG. 9 is a circuit diagram in which a bidirectional switch 300 is a reverse-blocking IGBT.
Figure 10:
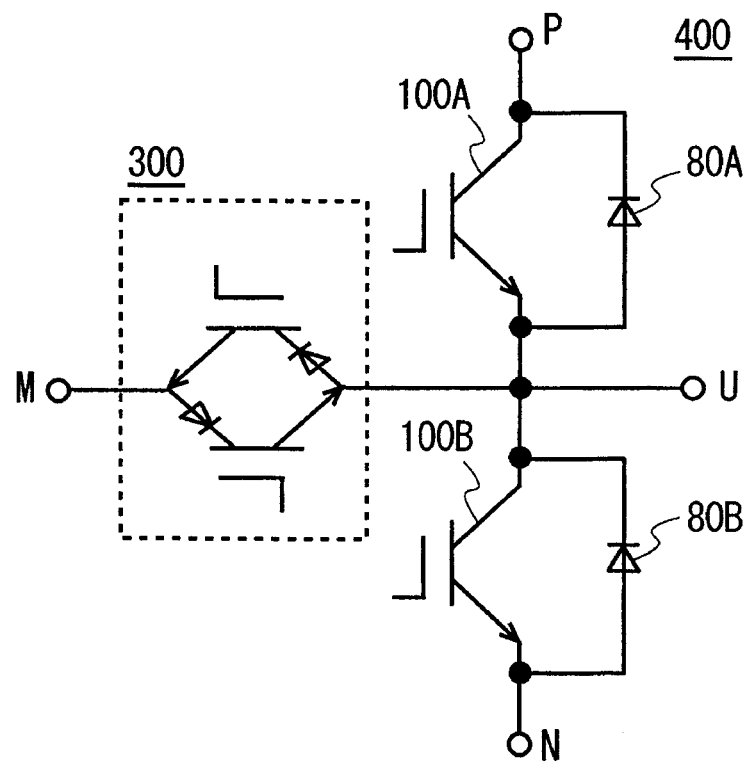
FIG. 10 is a figure that shows a one-arm circuit of a multi-level inverter.

FIG. 9 is a circuit diagram that shows one example in which a bidirectional switch 300 is a reverse-blocking IGBT. FIG. 10 is a figure that shows one example of a one-arm circuit of a multi-level inverter.

Because the semiconductor device 100 having the separation layer 30 shown in FIG. 1 has reverse withstanding voltage, it can be used as a reverse-blocking IGBT. This reverse-blocking IGBT becomes a circuit that is equivalent to a series circuit in which a parasitic diode 2A having an anode and a cathode that are arranged in this order in a direction from a collector to an emitter of the IGBT 1A is connected in series. Then, the bidirectional switch 300 can be configured by connecting, reversely and in parallel, the IGBT 1A to which the parasitic diode 2A is connected in series with an IGBT 1B to which a parasitic diode 2B is connected in series as shown in FIG. 9.

FIG. 8B shows the circuit formed by connecting the diode 80 in parallel with the semiconductor device 100.

A one-arm circuit of a multi-level inverter shown in FIG. 10 can be configured by connecting in series two of the circuit of FIG. 8B, and connecting, at a connection point of the series connection, the bidirectional switch 300 of FIG. 9. Two DC power sources are connected in series, the cathode potential is P, the anode potential is N and the midpoint potential is M.

In FIG. 10, a U-phase series circuit 400 in which the IGBT 100A formed by connecting the diode 80A reversely and in parallel, is connected in series with the IGBT 100B formed by connecting the diode 80B reversely and in parallel. The bidirectional switch 300 explained with reference to FIG. 9 is connected as a U-phase bidirectional switch to a series connection point U of the U-phase series circuit 400 and a connection point M between the two DC power sources. By providing a V-phase circuit and a W-phase circuit in the same configuration with this circuit consisting of the U-phase series circuit 400 and the bidirectional switch 300, a three-phase bridge inverter is configured. Also, the series connection points U, V, W are connected to an electric motor which is a load.

Because by employing this circuit configuration, potential applied to the electric motor can output P potential, N potential and M potential, a three-level output inverter can be achieved. Because this three-level scheme generates less harmonic contents and reduce the switching loss of a switch element as compared to a two-level type inverter, a highly efficient system can be constructed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order. A phrase like "formed on a front surface side" may mean both that an element is formed on a front surface and that the element is formed on a front surface with a predetermined member intervening therebetween.

What is claimed is:

1. A semiconductor device comprising:
    a base layer of a first conductivity type having a MOS gate structure being formed on a front surface side thereof;
    a first collector layer of a second conductivity type formed on a rear surface side of the base layer;
    a second collector layer of the second conductivity type formed on a rear surface side of the first collector layer with a material that is the same with that of the base layer, the second collector layer being formed to be thinner than the first collector layer and to have a higher impurity concentration than that of the first collector layer;
    a collector electrode formed on a rear surface side of the second collector layer; and
    a separation layer of the second conductivity type that surrounds the MOS gate structure on a front surface of the base layer and is formed from a front surface of the base layer to a front surface of the first collector layer, wherein
    the first collector layer has a region that is adjacent to the separation layer having both impurities diffused from the front surface side of the base layer and impurities diffused from the rear surface side of the base layer.

2. The semiconductor device according to claim 1, wherein at the first collector layer, an impurity concentration of the region that is adjacent to the separation layer is higher than an impurity concentration, at the same depth position, of a region of the first collector layer that is not adjacent to the separation layer.

3. The semiconductor device according to claim 1, wherein the base layer, the first collector layer and the separation layer are formed by implanting impurities corresponding to the second conductivity type selectively to a region on a front surface side of a base substrate of the first conductivity type, the region being corresponding to the separation layer, and implanting impurities corresponding to the second conductivity type to a rear surface side of the base substrate, and then performing a diffusion process simultaneously on the impurities implanted from the front surface side and rear surface side of the base substrate.

4. The semiconductor device according to claim 3, wherein the first collector layer having a predetermined thickness is formed by grinding a rear surface of the first collector layer after performing the diffusion process.

5. The semiconductor device according to claim 1, wherein the first collector layer is directly formed on the rear surface side of the base layer, and the second collector layer is directly formed on the rear surface side of the first collector layer.

6. The semiconductor device according to claim 1, wherein the first collector layer is a p+ type layer, and the second collector layer is a p+ type layer.

7. The semiconductor device according to claim 1, wherein an impurity concentration of the first collector layer is approximately $2 \times 10^{14}$ cm$^{-3}$ to $2 \times 10^{15}$ cm$^{-3}$.

8. The semiconductor device according to claim 7, wherein an impurity concentration of the second collector layer is approximately $1 \times 10^{17}$ cm$^{-3}$ to $5 \times 10^{18}$ cm$^{-3}$.

* * * * *